(12) United States Patent
Lee et al.

(10) Patent No.: US 9,490,159 B2
(45) Date of Patent: Nov. 8, 2016

(54) SEMICONDUCTOR DEVICE AND METHOD OF MANUFACTURING THE SAME

(71) Applicant: SK hynix Inc., Icheon-si Gyeonggi-do (KR)

(72) Inventors: Seung Cheol Lee, Icheon-si (KR); Yang Bok Lee, Seoul (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/814,756

(22) Filed: Jul. 31, 2015

(65) Prior Publication Data

US 2015/0340373 A1    Nov. 26, 2015

Related U.S. Application Data

(62) Division of application No. 13/941,964, filed on Jul. 15, 2013, now Pat. No. 9,130,013.

(30) Foreign Application Priority Data

Mar. 5, 2013  (KR) .................. 10-2013-0023386

(51) Int. Cl.
| | | |
|---|---|---|
| H01L 21/762 | (2006.01) | |
| H01L 21/8234 | (2006.01) | |
| H01L 21/311 | (2006.01) | |
| H01L 21/02 | (2006.01) | |
| H01L 21/764 | (2006.01) | |
| H01L 27/115 | (2006.01) | |
| H01L 29/66 | (2006.01) | |

(52) U.S. Cl.
CPC ... *H01L 21/76224* (2013.01); *H01L 21/02126* (2013.01); *H01L 21/31138* (2013.01); *H01L 21/764* (2013.01); *H01L 21/823475* (2013.01); *H01L 21/823481* (2013.01); *H01L 27/11519* (2013.01); *H01L 27/11524* (2013.01); *H01L 29/66825* (2013.01)

(58) Field of Classification Search
CPC ..................... H01L 21/3116; H01L 21/76883; H01L 21/76802; H01L 27/11521; H01L 29/42332; H01L 29/4234; H01L 29/66825
USPC ........................................................ 438/706
See application file for complete search history.

(56) References Cited

U.S. PATENT DOCUMENTS

| | | | | |
|---|---|---|---|---|
| 4,749,440 A | * | 6/1988 | Blackwood | ....... H01L 21/31116 134/1.3 |
| 2015/0017275 A1 | * | 1/2015 | Mitamura | ............... G03F 7/004 425/385 |

* cited by examiner

*Primary Examiner* — Michael Lebentritt
(74) *Attorney, Agent, or Firm* — William Park & Associates Ltd.

(57) ABSTRACT

A method of manufacturing a semiconductor device includes forming isolation layers in a first direction at trenches at isolation regions defined at a semiconductor substrate and forming gate lines in a second direction crossing the first direction over the isolation layers and active regions defined between the isolation layers, performing a dry-etch process to remove the isolation layers, and forming an insulating layer over the semiconductor substrate to form a first air gap extending in the first direction in the trenches and a second air gap extending in the second direction between the gate lines.

15 Claims, 13 Drawing Sheets

FIG. 3
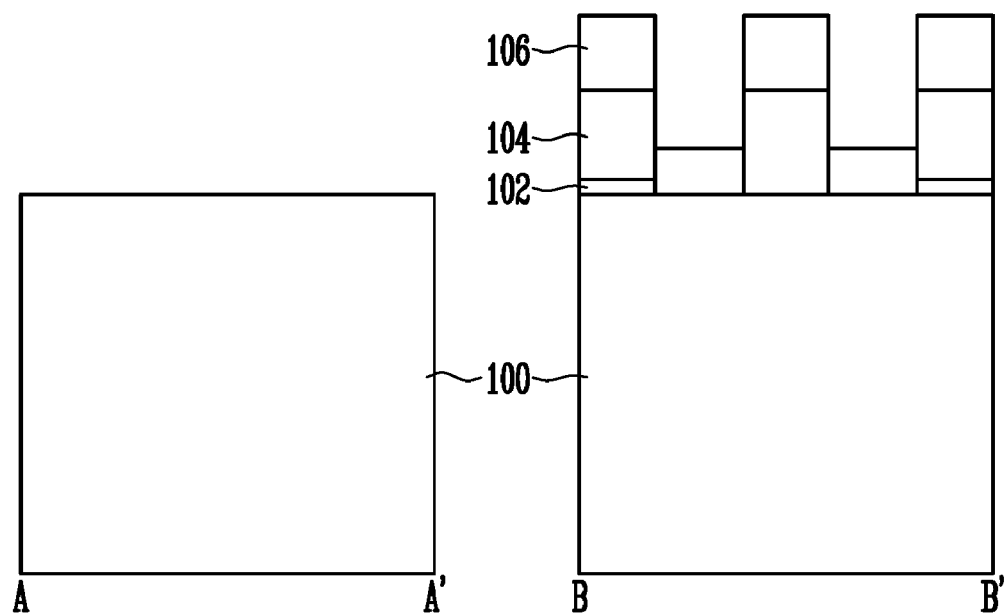
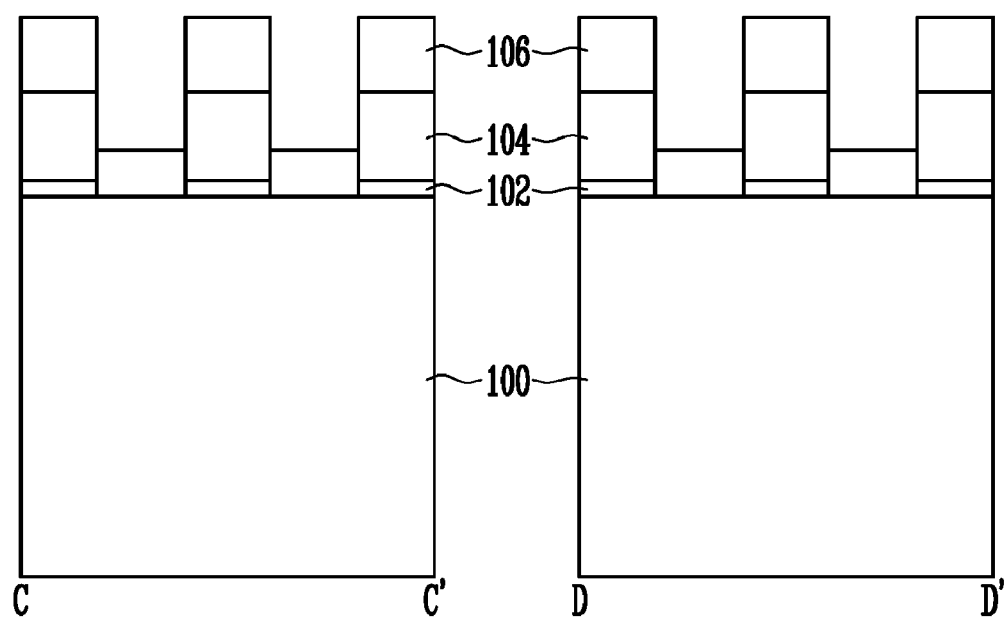

FIG. 4
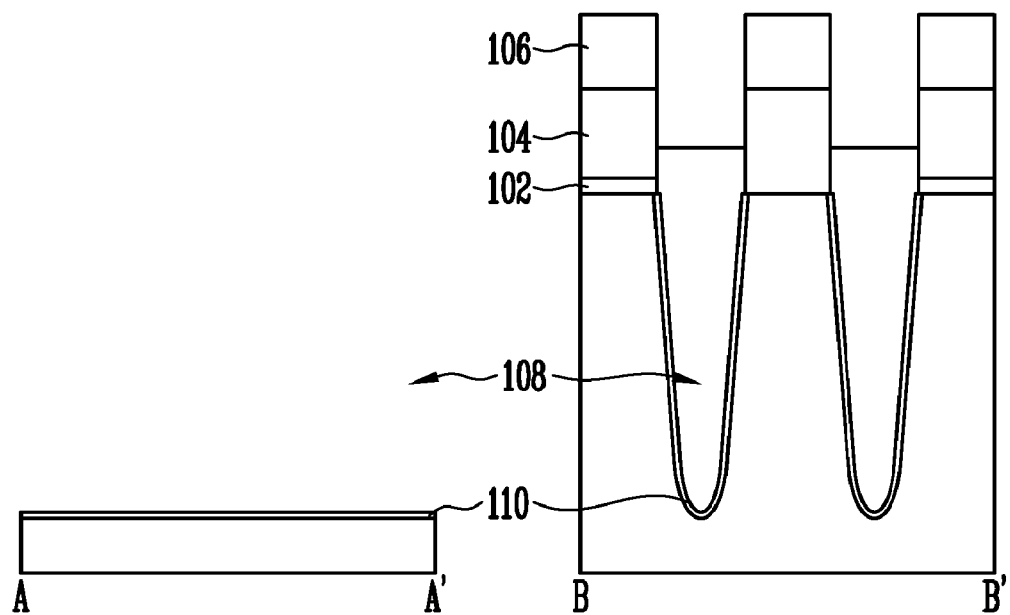
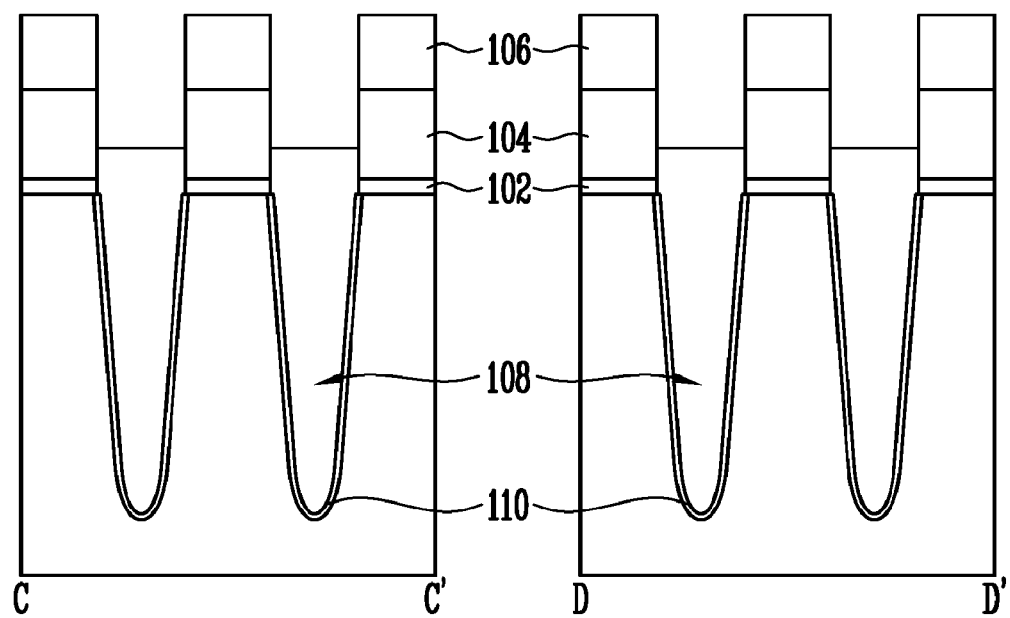

FIG. 5
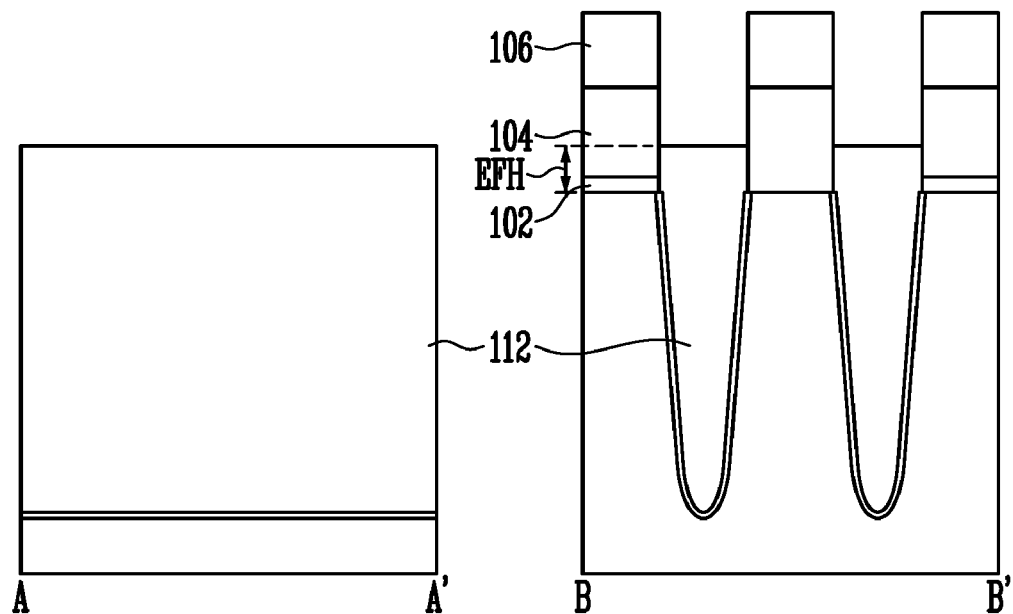
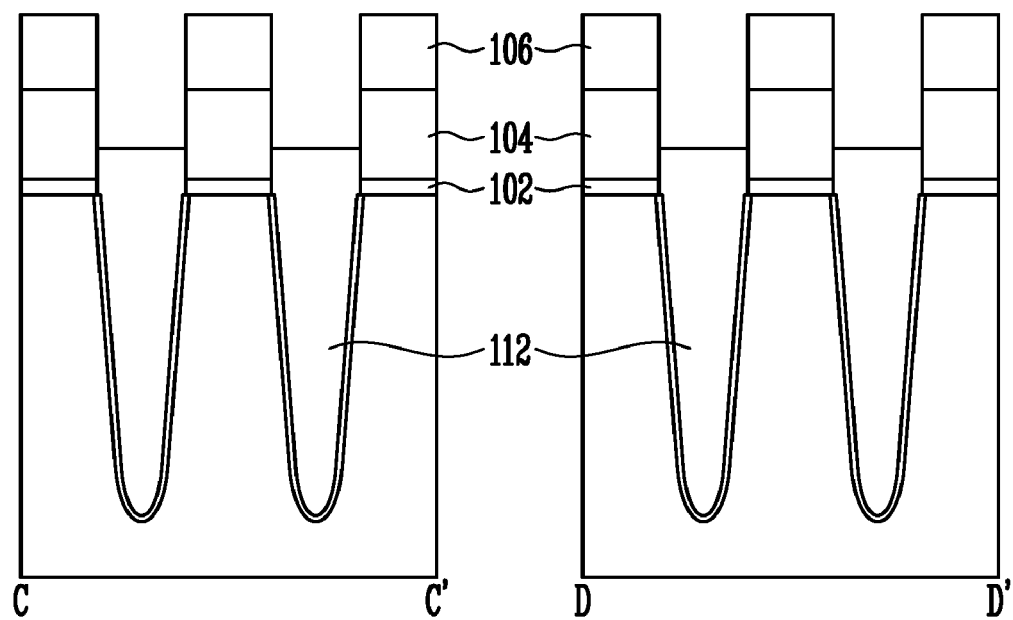

FIG. 9
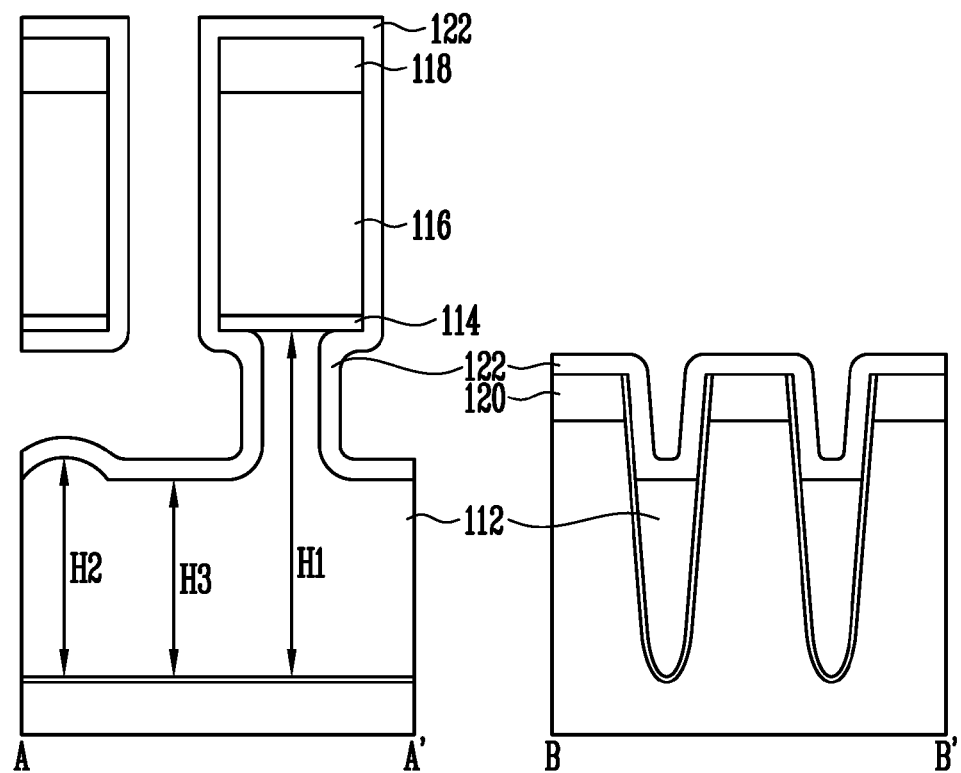
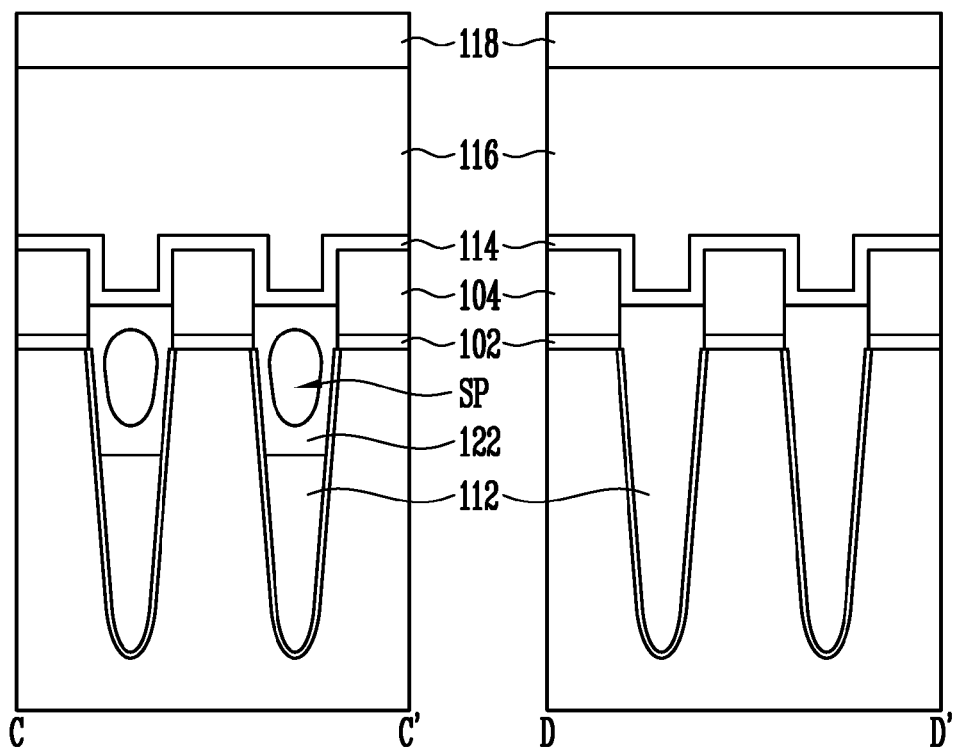

FIG. 10
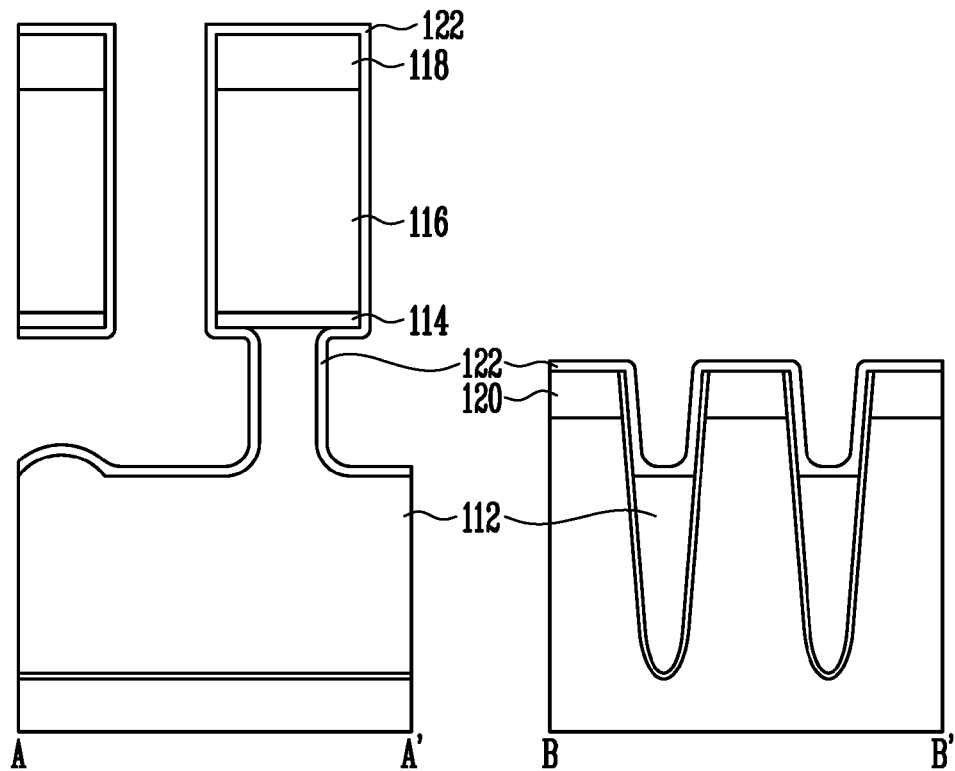
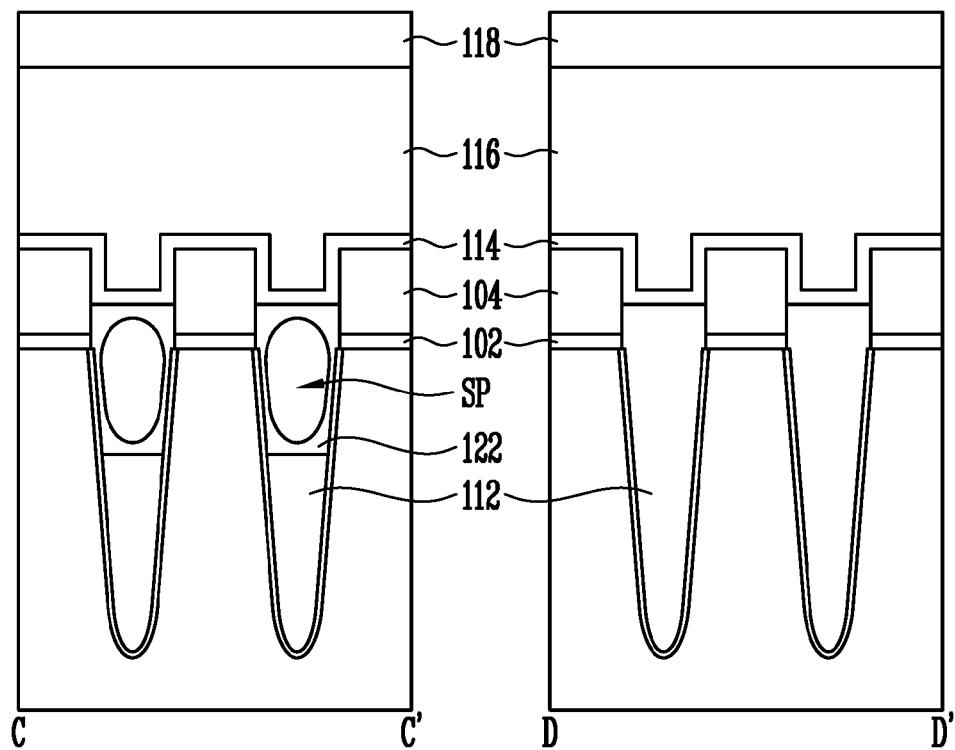

FIG. 11
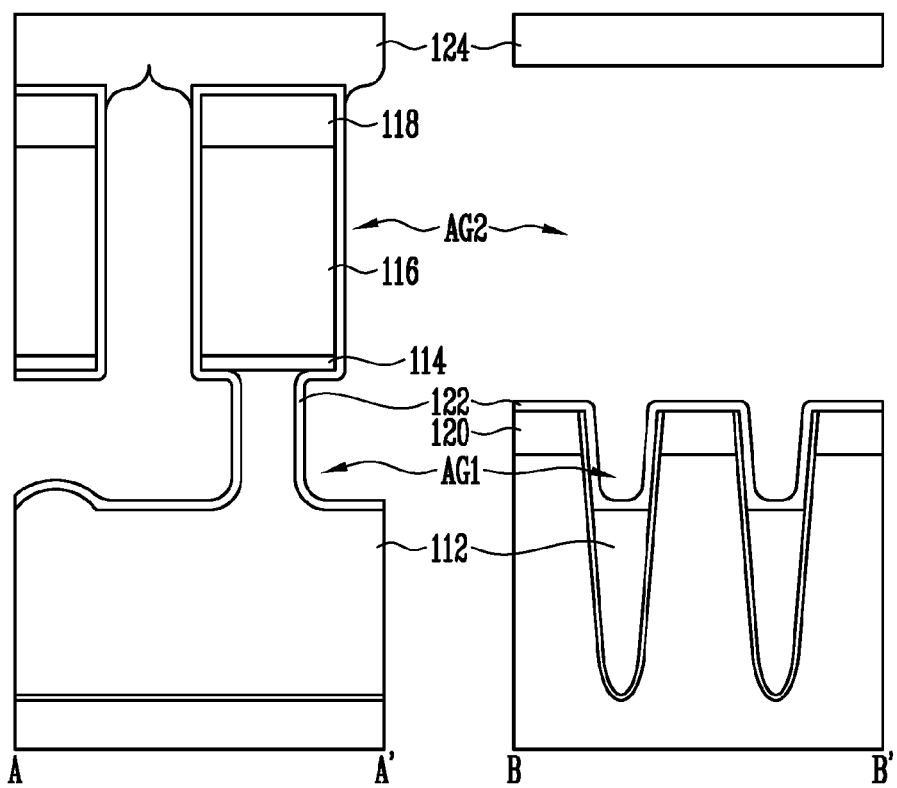
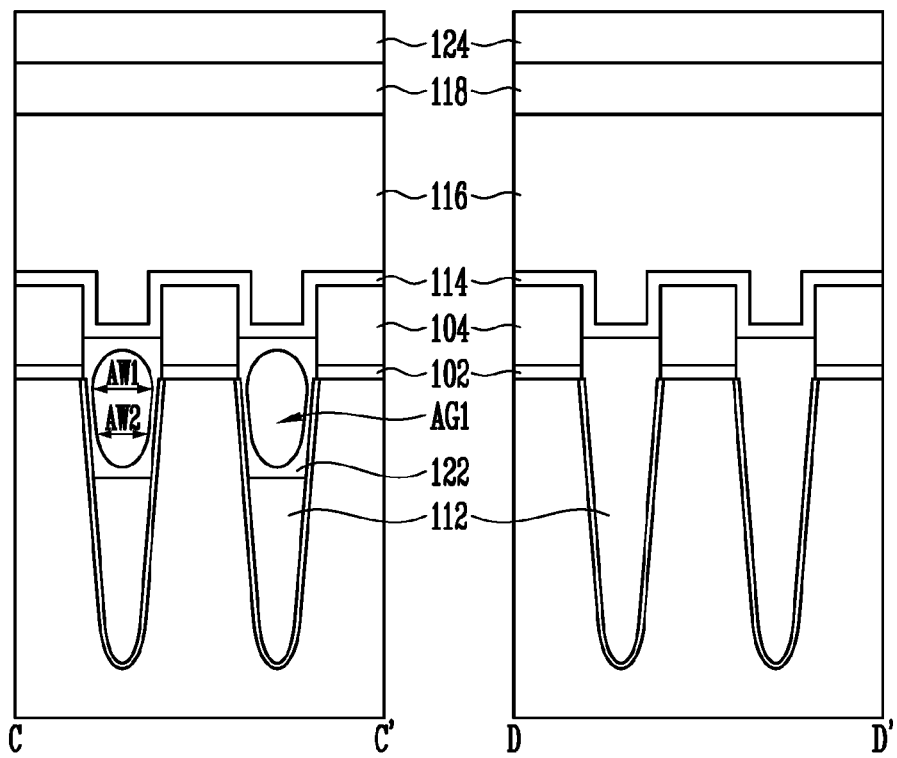

SEMICONDUCTOR DEVICE AND METHOD OF MANUFACTURING THE SAME

CROSS-REFERENCE TO RELATED APPLICATION

The present application claims priority to Korean patent application number 10-2013-0023386 filed on Mar. 5, 2013, in the Korean Intellectual Property Office, the entire disclosure of which is incorporated by reference herein.

BACKGROUND

1. Technical Field

Various embodiments relate generally to an electronic device and, more particularly, to a semiconductor device and a manufacturing method thereof.

2. Related Art

As the degree of integration of semiconductor devices increases, the devices and the space between the devices become smaller and shorter. As a result, problems that affect reliability of the semiconductor devices, for example, interference phenomena causing an operational error or electrical properties degradation, may be encountered.

U.S. Laid-open Patent No. US2012/0126303 teaches that an air gap is formed in a trench in an isolation region and between gate lines. Particularly, referring to FIGS. 17A to 17D, an insulating layer 3 formed in the trench is removed by a wet-etch process. However, while the insulating layer 3 is removed, a bottom surface of an interelectrode insulating layer 7 is exposed, which creates problems because the interelectrode insulating layer 7 is also etched by the wet-etch process performed to remove the insulating layer 3.

BRIEF SUMMARY

Various embodiments relate to a semiconductor device having improved reliability.

A method of manufacturing a semiconductor device according to an embodiment of the present invention may include forming isolation layers in a first direction at trenches at isolation regions defined at a semiconductor substrate and forming gate lines in a second direction crossing the first direction over the isolation layers and active regions defined between the isolation layers, performing a dry-etch process to remove the isolation layers, and forming an insulating layer over the semiconductor substrate to form a first air gap extending in the first direction in the trenches and a second air gap extending in the second direction between the gate lines.

A method of manufacturing a semiconductor device according to an embodiment of the present invention may include forming an isolation layer at an isolation region of a semiconductor substrate, forming a gate line over the isolation layer and an active region of the semiconductor substrate, and etching the isolation layer below the gate line using a dry-etch process having at least 7:1 etch selectivity with respect to an oxide film exposed at a bottom surface of the isolation layer and a bottom surface of the gate line.

A semiconductor device according to an embodiment of the present invention may include trenches formed in a first direction in parallel at isolation regions of a semiconductor substrate, first air gaps formed in the trenches, gate lines formed in a second direction crossing the first direction over the first air gaps and active regions of the semiconductor substrate between the isolation regions, an interlayer insulating layer formed over the semiconductor substrate including the gate lines, and second air gaps formed between the gate lines in the interlayer insulating layer.

A memory system according to an embodiment includes a memory controller and a non-volatile memory device, the non-volatile memory device including trenches formed in a first direction in parallel at isolation regions of a semiconductor substrate, first air gaps formed in the trenches, gate lines formed in a second direction crossing the first direction over the first air gaps and active regions of the semiconductor substrate between the isolation regions, an interlayer insulating layer formed over the semiconductor substrate including the gate lines, and second air gaps formed between the gate lines in the interlayer insulating layer.

A one NAND flash memory apparatus according to an embodiment includes a controller and a NAND cell array, the NAND cell array including trenches formed in a first direction in parallel at isolation regions of a semiconductor substrate, first air gaps formed in the trenches, gate lines formed in a second direction crossing the first direction over the first air gaps and active regions of the semiconductor substrate between the isolation regions, an interlayer insulating layer formed over the semiconductor substrate including the gate lines, and second air gaps formed between the gate lines in the interlayer insulating layer.

A computing system according to an embodiment includes a central processing unit and a memory system, the memory system including a memory controller and a flash memory apparatus, the flash memory apparatus including trenches formed in a first direction in parallel at isolation regions of a semiconductor substrate, first air gaps formed in the trenches, gate lines formed in a second direction crossing the first direction over the first air gaps and active regions of the semiconductor substrate between the isolation regions, an interlayer insulating layer formed over the semiconductor substrate including the gate lines, and second air gaps formed between the gate lines in the interlayer insulating layer.

BRIEF DESCRIPTION OF THE DRAWINGS

FIGS. 3 to 11 are cross-sectional diagrams of a semiconductor device according to an embodiment of the present invention;

DETAILED DESCRIPTION

Hereinafter, various embodiments will be described in detail with reference to the accompanying drawings. Wherever possible, the same reference numbers will be used throughout the drawings to refer to the same or like parts. The figures are provided to allow those having ordinary skill in the art to understand the scope of the embodiments of the disclosure. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Figure 1:
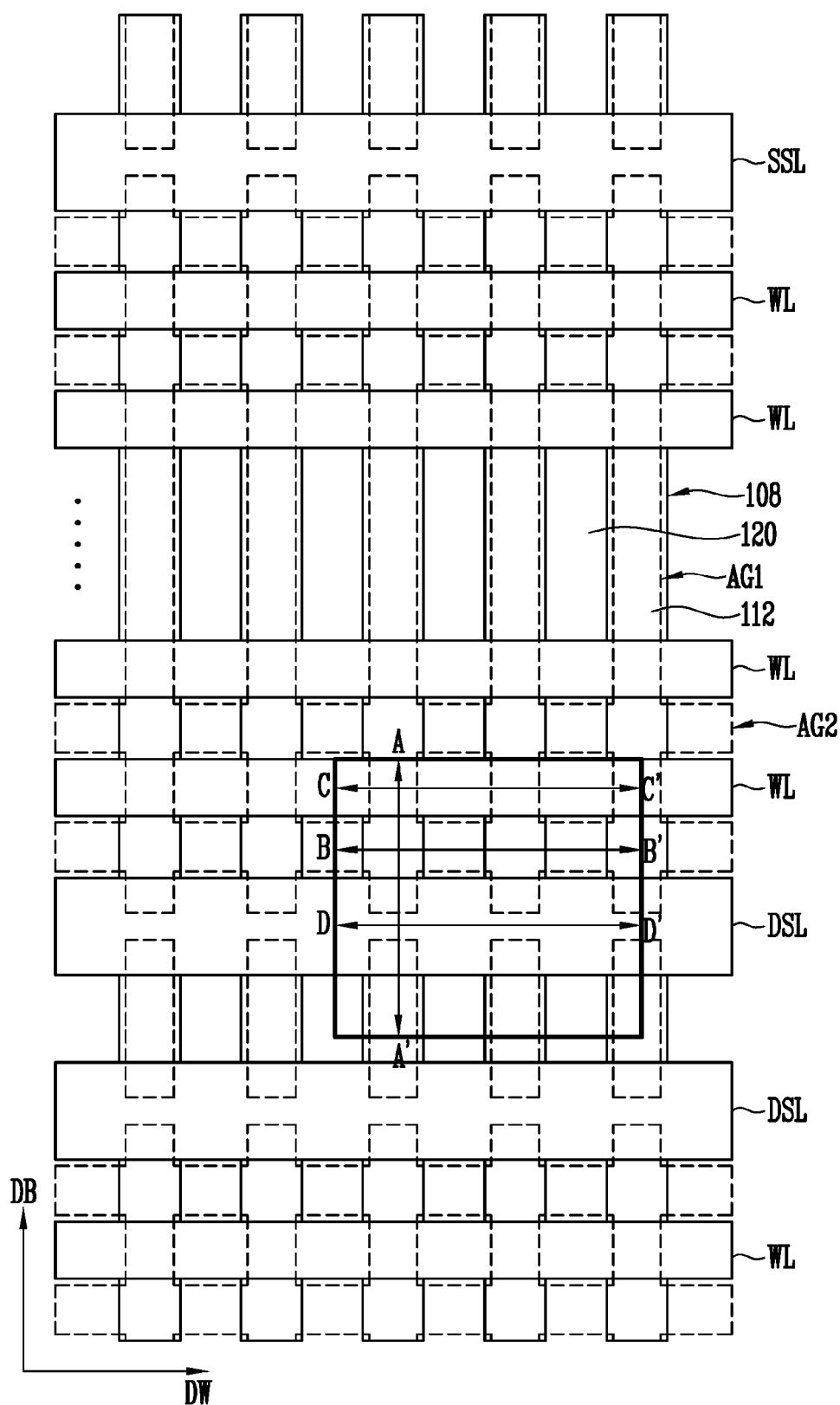
FIG. 1 is a plan view of a semiconductor device according to an embodiment of the present invention.
Figure 2:
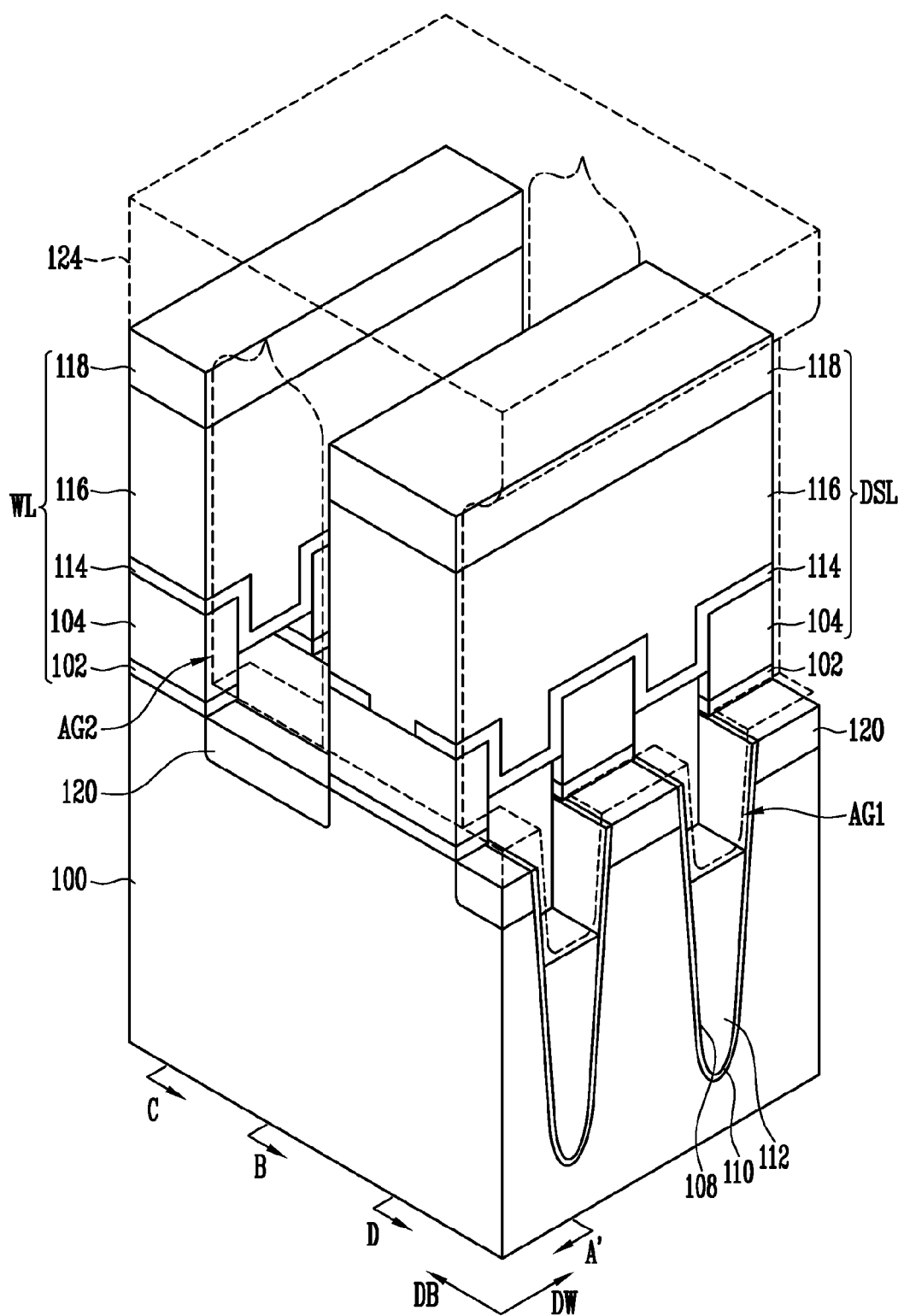
FIG. 2 is a three-dimensional diagram illustrating the square portion emphasized in FIG. 1.

FIG. 1 is a plan view of a semiconductor device according to an embodiment of the present invention. FIG. 2 is a three-dimensional diagram illustrating the square portion emphasized in FIG. 1

Referring to FIGS. 1 and 2, a plurality of trenches 108 are formed in a first direction or bitline direction DB at isolation regions of a semiconductor substrate 100. Active regions are defined between the isolation regions. And gate lines WL, DSL and SSL are formed in a second direction or word line direction DW crossing the trenches 108 over the isolation regions and the active regions. Specifically, the gate lines WL, DSL and SSL are formed in the second direction DW over the semiconductor substrate 100 such that they cross the active regions and the isolation regions of the semiconductor substrate 100. Impurity regions or sources/drains 120 are formed at the active regions of the semiconductor substrate 100 between the gate lines WL, DSL and SSL.

In the case of a NAND flash device, the gate lines may include cell gate lines WL and select gate lines DSL and SSL. The select gate lines DSL and SSL include drain select lines DSL and source select lines SSL. Each of the gate lines WL, DSL or SSL may be a stacked structure comprising a tunnel insulating layer 102, a floating gate 104, a dielectric layer 114 and a control gate 116. The floating gate 104 may be provided at the active region only. The control gate 116 may be a stacked structure comprising a doped polysilicon layer 122 (as shown in FIG. 9) and a metallic conductive layer (not illustrated).

First air gaps AG1 extend in the first direction DB in the trenches 108, and second air gaps AG2 extend in the second direction DW between the gate lines WL, DSL and SSL. The first air gap AG1 and the second air gap AG2 are coupled to each other at where the first air gap AG1 and the second air gap AG2 cross each other.

Particularly, the first air gaps AG1 is formed at where an isolation layer 112 is etched in the trenches 108, but since an upper portion of the isolation layer 112 remains below the select gate lines DSL and SSL, the first air gap AG1 is isolated below the select gate lines DSL and SSL.

Additionally, a cross-section of the first air gap AG1 in the second direction DW in the trench 108 is oval-shaped, having a wide upper portion and a narrow lower portion, which is described in more detail in FIG. 10.

Liner insulating layers 110 may be formed on sidewalls and bottom surfaces of the trenches 108. The liner insulating layer 110 may be formed of an oxide film.

After the isolation layers 112 are formed in the trenches 108 and a wet-etch process is performed on the isolation layers 112 in order to form the first air gaps AG1 in the trenches 108, the lower portions of the isolation layers 112 may remain in the trenches 108. Therefore, the first air gaps AG1 may be formed over the isolation layers 112 in the trenches 108.

Insulating layers 122 (as seen in FIG. 9) are formed such that they are deposited more at the upper portions (particularly at a corner of the upper portions) than at the sidewalls of the gate lines WL, DSL and SSL. That is, the insulating layer 122 may be formed of a PE-USG (Plasma Enhanced undoped silicate glass) layer having poor step coverage.

The isolation layer 112 may be formed of a material having a high etch selectivity rate with respect to the oxide film during the wet-etch process and may be formed of a spin-on-glass (SOG) layer or a polysilazane (PSZ) layer.

Additionally, the height of the isolation layer 112 remaining in the trench 108 may vary depending on the location. Specifically, the isolation layer 112 below the gate lines WL, DSL and SSL is higher than the isolation layer 112 between the gate lines WL, SSL and DSL. Also, although the bottom surface of the select gate lines DSL and SSL and the upper portion of the isolation layer 112 are in contact with each other, since the bottom surface of the cell gate lines WL and the upper portion of the isolation layer 112 are not in contact with each other, the isolation layer 112 below the select gate lines DSL, SSL is higher than the isolation layer 112 at the cell gate line WL. This is shown in more detail in FIG. 8.

As the second air gap AG2 extending in the second direction DW between the gate lines WL, SSL and DSL is formed, parasitic capacitance between the gate lines WL, SSL and DSL is reduced, thereby reducing the interference phenomenon. Also, as the first air gaps AG1 extending in the first direction DB in the trenches 108 are formed, parasitic capacitance between sources/drains 120 is reduced, thereby reducing the interference phenomenon. That is, an embodiment of the present invention is capable of suppressing the interference phenomenon by reducing parasitic capacitance between the impurity regions 120 of different memory strings. Particularly, as the air gaps AG1 and AG2 are connected to each other, the parasitic capacitance between the floating gate 104 and the impurity region 120 below the floating gate of a different memory string adjacent to the floating gate 104 is reduced, thereby decreasing the interference phenomenon.

Hereinafter, a method of manufacturing the semiconductor device having the structures mentioned above will be explained.

FIGS. 3 to 11 are cross-sectional diagrams of a semiconductor device according to an embodiment of the present invention.

In FIGS. 3 to 9, A-A' is a cross-sectional diagram showing the trenches 108 in FIG. 2 cut across in the second direction DB, B-B' is a cross-sectional diagram showing the semiconductor substrate 100 between the cell gate line WL and the select gate line DSL in FIG. 2 cut across in the first direction DW, C-C' is a cross-sectional diagram showing the cell gate line WL in FIG. 2 cut across in the first direction DW, and D-D' is a cross-sectional diagram showing the select gate line DSL in FIG. 2 cut across in the first direction DW.

Referring to FIGS. 2 and 3, processes are performed such that the isolation layers are formed in the first direction (or in the bitline direction) in the trenches formed at the isolation regions of the semiconductor substrate and the gate lines are formed in the second direction (or in the word line direction) crossing the first direction over the isolation layers and the active regions of the semiconductor substrate defined between the isolation layers. Hereinafter, the process for forming the isolation layers and the gate lines in a NAND flash apparatus will be described as an example.

The tunnel insulating layer 102, a silicon layer 104 for forming the floating gate and a hard mask layer 106 are formed over the semiconductor substrate 100. Thereafter, the hard mask layer 106, the silicon layer 104, and the tunnel insulating layer 102 of the isolation region are etched. As a result, the isolation region of the semiconductor substrate 100 is exposed.

The silicon layer 104 may be formed of an amorphous silicon layer or a polysilicon layer and may be formed of an undoped layer or a doped layer having impurities or may be a stacked structure having an undoped layer or a doped layer having impurities.

Referring to FIGS. 2 and 4, the trenches 108 are formed by etching the semiconductor substrate 100 in the exposed isolation regions. The trenches 108 may be formed in the first direction DB in parallel. The trenches 108 have upper portions that are wider than their lower portions.

Thereafter, the liner insulating layers 110 are formed on the sidewalls and the bottom surfaces of the trenches 108. The liner insulating layers 110 may be formed using an oxide process. As the damaged portions from etching at the sidewalls and the bottom surfaces of the trenches 108 are oxidized, the liner insulating layers 110 change into liner oxide layers 110. That is, the liner insulating layers 110 may be formed of silicon oxide layers. Additionally, oxide layers (not shown) may be formed on the sidewalls of the silicon layers 104 that are exposed from the process for forming the liner insulating layers 110.

A sealing insulating layer (not shown) may be formed over the entire structure. The sealing insulating layer may be formed of a high temperature oxide (HTO) layer using a deposition method.

Referring to FIGS. 2 and 5, a process for forming the isolation layers 112 in the trenches 108 is performed. The isolation layer 112 may be formed using a material having an adequate etch selectivity with respect to the silicon oxide layer in a wet-etch process and may be formed of a flowable insulating layer like the SOG layer or the PSZ layer. For example, the PSZ layer is applied over the entire structure of the semiconductor substrate 100 such that the trenches 108 are filled. Since the PSZ layer 112 has flowability, even though the trenches may have widths that are narrow and deep, the lower portions of the trenches 108 may be sufficiently filled. Thereafter, a heat treatment is performed in order to harden and densify the PSZ layer 112.

Thereafter, the hardened PSZ layer 112 is etched such that the PSZ layer 112 only remains at the isolation region between the silicon layers 104. The surface of the upper portion of the PSZ layer 112 may be higher than the surface of the substrate 100 and lower than the surface of the upper portion of the silicon layer 104. As a result, the isolation layer 112 is formed in the first direction DB at the isolation region using the PSZ layer remaining in the trenches 108.

Additionally, since a height EFH(Effective Field Height) from the substrate 100 to the isolation layer 112 determines the locations and the heights of the air gaps to be formed in the trenches 108 in a subsequent process, an etching process may be performed on the isolation layers 112 such that the height EFH of the isolation layer 112 is appropriately adjusted.

Figure 6:
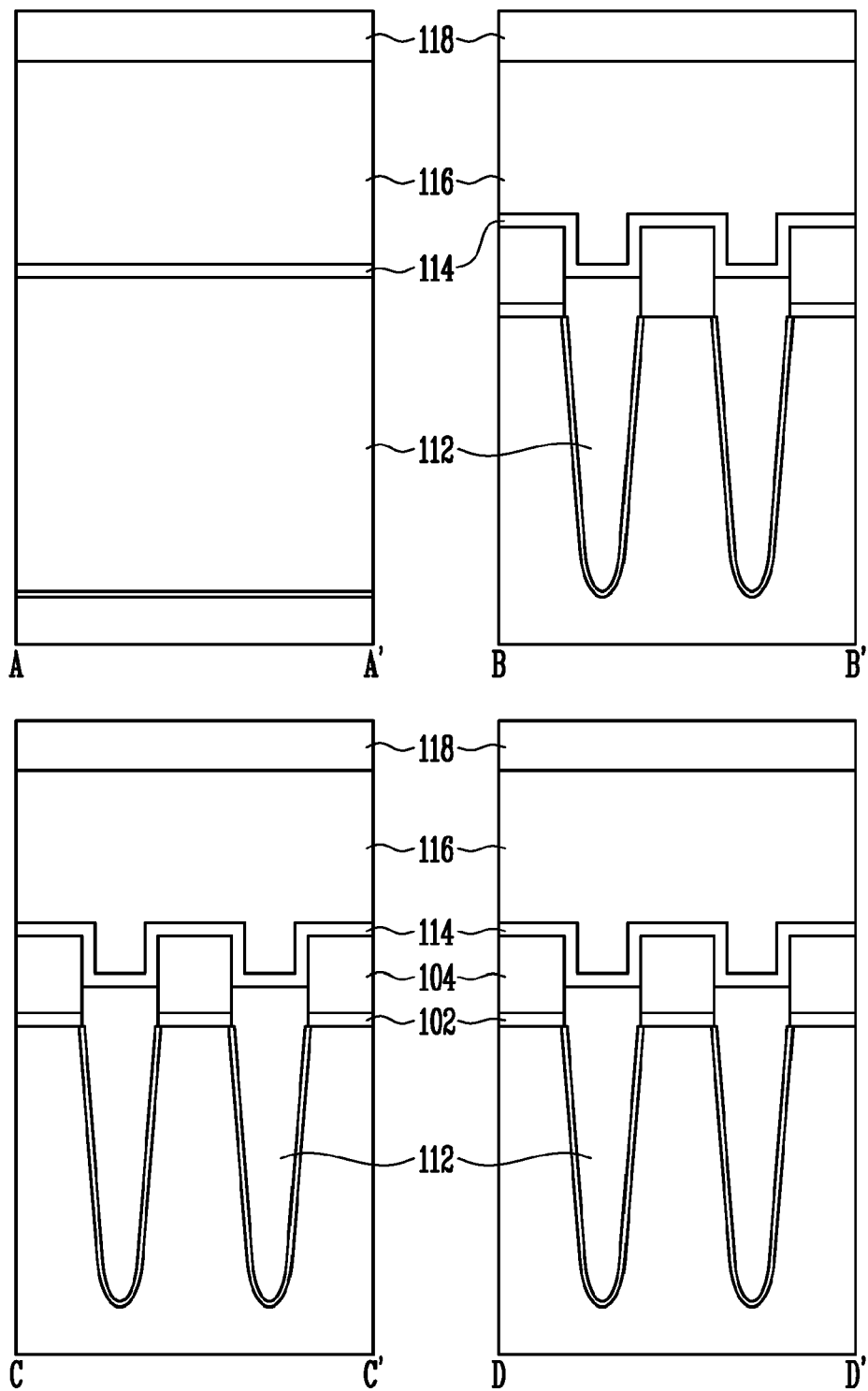

Referring to FIGS. 2 and 6, the hard mask layer 106 in a higher position than the silicon layer 104 is removed. Thereafter, the dielectric layer 114, the conductive layer 116 and a hard mask 118 are formed over the entire structure.

The dielectric layer 114 may be formed as a stacked structure comprising an oxide layer, a nitride layer and an oxide layer. The conductive layer 116 is for forming the control gate and may be a stacked structure comprising a silicon layer and a metal material layer or may be formed only of the metal material layer. The silicon layer may comprise a doped polysilicon layer. The metal material layer may comprise tungsten, cobalt, aluminum, copper or a silicide layer thereof.

Figure 7:
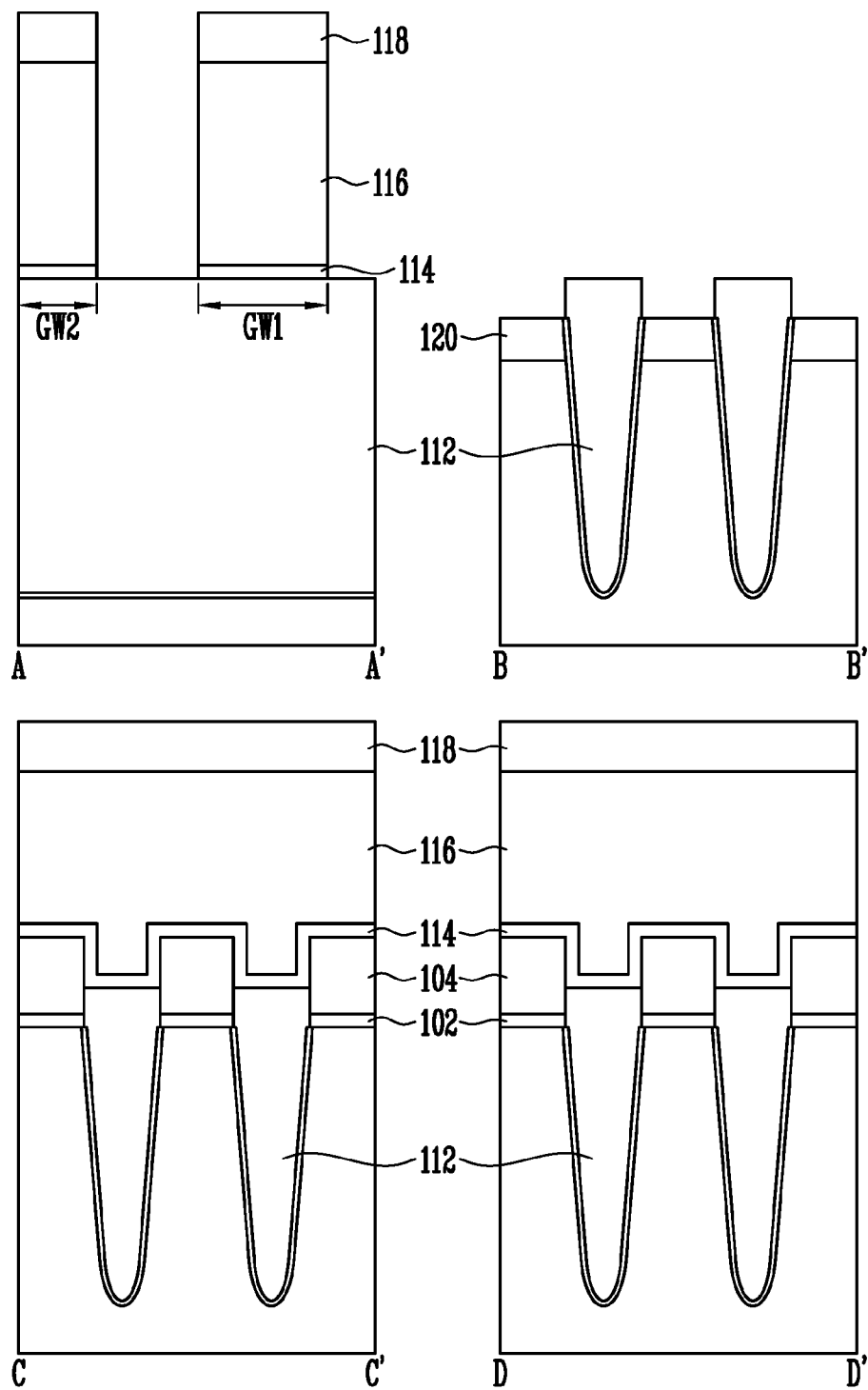

Referring to FIGS. 2 and 7, the hard mask 118, the conductive layer 116 and the dielectric layer 114 are etched in the shape of a line in the second direction DW. As a result, the control gate is formed. Thereafter, a portion of the silicon layer 104 that is exposed is removed using an etching process. The silicon layer 104 remains below the control gate and changes into the floating gate. As a result, the gate lines WL and DSL having a stacked structure comprising the tunnel insulating layer 102, the silicon layer 104, the dielectric layer 114 and the control gate 116 are formed in the second direction DW crossing the isolation regions (or the isolation layers).

Here, a width GW1 of the select gate lines DSL may be wider than a width GW2 of the cell gates. Also, the space between the select gate lines DSL may be greater than the space between the cell gate lines WL.

Additionally, the isolation layers 112 formed at the isolation regions are exposed such that the upper portions protrude more than the surface of the semiconductor substrate 100 between the gate lines WL and DSL.

Thereafter, the impurity regions 120 to be used as the sources/drains by injecting impurities into the active regions of the semiconductor substrate 100 exposed between the gate lines WL and DSL are formed.

Figure 8:
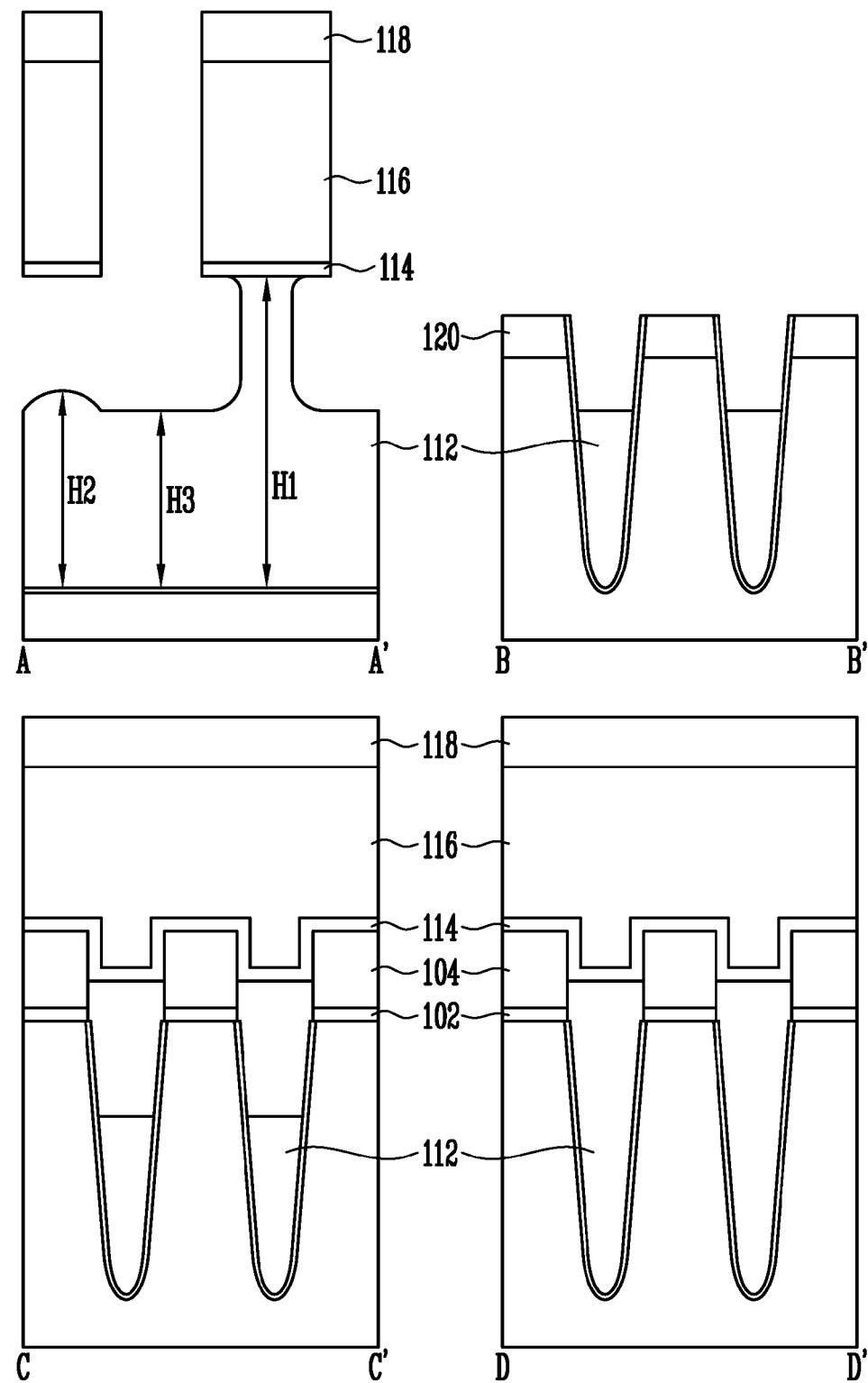

Referring to FIGS. 2 and 8, an etching process is performed on the isolation layer 112. Here, at a peripheral circuit region, the etching process may be performed on the isolation layer 112 in the state in which a mask 301 is formed, the mask 301 covering a cell region such that the isolation layer is not etched and exposing the peripheral circuit region. Consequently, even after the etching process is performed, the isolation layer 112 still remains at the peripheral circuit region.

An etching process is performed to remove the upper portions of the isolation layers 112. As the upper portions of the isolation layers are removed, space is formed in the upper portions of the trenches 108, and the air gaps are formed in the space of the upper portions of the trenches 108 in a subsequent process.

All of the upper portions of the isolation layers 112 in contact with the bottom surfaces of the cell gate lines WL below the cell gate lines WL are removed. However, only parts of the isolation layers 112 that contact the bottom surfaces of the select gate lines DSL below the select gate lines DSL may be removed. That is, even after the etching process is completed on the isolation layers 112, the isolation layers 112 may remain in the state in which the centers of the bottom surfaces of the select gate lines and the upper portions of the isolation layers 112 are in contact with each other below the select gate lines DSL. As a result, the air gaps formed in the trenches 108 in the subsequent process are isolated below the select gate lines DSL.

Additionally, the bottom surfaces of the oxide layers included in the gate lines WL and DSL are exposed as the isolation layers 112 in contact with the bottom surfaces of the oxide layers included in the bottom surfaces of the gate lines WL and DSL or the dielectric layers 114 are removed during the etching process. Consequently, the isolation layers 112 is to be etched with minimum damage to the oxide layers being exposed from etching.

In order to minimize the etching damage to the oxide layer, the etch selectivity with respect to the oxide layer and the isolation layer 112 may be, as much as possible, the highest, and the isolation layer may be etched more than the oxide layer by performing the etching process under the condition that the etch selectivity with respect to the isolation layer and the oxide layer is at least 7:1 (or may be at least 15:1). In order to minimize the damage to the oxide layer from etching when the isolation layer is etched, the etch selectivity is to be high. Thus, the higher the etch selectivity, the better it is. Although U.S. Laid-open Patent No. US2012/0126303 discloses that the isolation layer is etched using a wet-etch process, to date, no disclosure has been made to a wet-etch process with at least 7:1 etch selectivity with respect to the isolation layer formed of PSZ and the silicon oxide layer. Also, even in the case of a typical dry-etch process, the etch selectivity varies depending on an etch gas being used, and no disclosure has been made to a dry-etch process with at least 7:1 etch selectivity.

In order to secure the etch selectivity with respect to the isolation layer and the oxide layer to be at least 7:1, a dry-etch process using a fluorine-containing etchant or a hydrogen-containing etchant is proposed. For example, the fluorine-containing etchant and the hydrogen-containing etchant may be used in etching the isolation layer 112 using a dry-etch process. To illustrate, the fluorine-containing etchant may include $NF_3$ or HF, and a hydrogen-containing etchant may include $H_2O$. Also, a dry-etch process using plasma may be applied. Etching the isolation layer under the above conditions will set the etch selectivity to 7:1 or higher with respect to the isolation layer and the oxide layer while etching the isolation layer with minimum damage to the oxide layer.

Additionally, when an etching process is performed on the isolation layers 112, when bias applied to the substrate 100 increases, it becomes difficult to etch the isolation layers 112 below the cell gate lines WL because the etch process is performed anisotropically. Consequently, the dry-etch process must be performed isotropically in order to etch the isolation layers 112 below the cell gate lines WL. As such, the bias applied to the substrate 100 may be adjusted when the dry-etch process is performed.

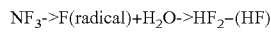

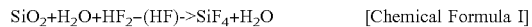  [Chemical Formula I]

As shown in the above chemical formula I, $HF_2-$, capable of adjusting the etch selectivity to at least 7:1 with respect to the PSZ and the oxide layer, is obtained from a reaction of $NF_3$ and $H_2O$.

It is difficult to control the etch selectivity to at least 7:1 with respect to the PSZ and the oxide layer using a dry-etch process under any other condition and it is also difficult to obtain such etch selectivity using a wet-etch process. Furthermore, when a wet-etch process is performed, a protective layer is to be formed to protect the oxide layer included in the tunnel insulating layer 102 or the dielectric layer 114. Considering the electrical characteristics of the cell, the polysilicon layer or a silicon nitride layer may not be directly formed on the surface of the gate lines WL, DSL and SSL even though the polysilicon layer or the silicon nitride layer may be used as a protective layer. Consequently, the silicon oxide layer is to be further formed before the protective layer is formed. And, the silicon oxide layer and the protective layer are to be removed after the air gap is formed in a subsequent process. Even when the wet-etch process is performed this way, the steps of the process are complicated.

Consequently, performing the dry-etch process for etching the isolation layer 112 under the conditions described above simplifies the process and minimizes the damage from etching to the oxide layer included in the tunnel insulating layer 102 or the dielectric layer 114. Additionally, when an etching process is performed on the isolation layers, the sidewalls and the bottom surfaces of the trenches 108 are protected by the liner insulating layers 110.

Specifically, a height H2 of the isolation layer 112 below the gate line and a height H1 of the gate line may be higher than a height H3 of the isolation layer 112 between the gate lines. Also, although the bottom surface of the select gate line and the upper portion of the isolation layer 112 are in contact with each other, since the bottom surface of the cell gate line and the upper portion of the isolation layer 112 are not in contact with each other, the height H1 of the isolation layer 112 below the select gate line is higher than the height H2 of the isolation layer 112 at the cell gate line.

Referring to FIGS. 2 and 9, the protective layer 122 is formed over the isolation layer 112. The protective layer 122 may be formed of the silicon oxide layer. The isolation layer 112 formed of the PSZ contains many impurities. Consequently, if a process is performed in the state in which the isolation layer 112 is exposed, the impurities released from the isolation layer 112 will reduce the properties of the surrounding layers. Consequently, the protective layer 122 is formed over the isolation layer 112 such that the isolation layer 112 is not exposed.

The protective layer 122 may be formed at a furnace using a deposition method, and since it is deposited at a high temperature, excellent layer properties may be obtained. The protective layer 122 may be formed over the surface of the entire structure formed at the substrate 100 according to the above method.

As the protective layer 122 is formed, space SP in the trenches 108 below the cell gate line WL becomes narrow. As a result, the sizes of the air gaps to be formed in the trenches 108 may be small. As the size of the air gap becomes smaller, it becomes difficult to effectively prohibit the interference phenomenon.

Referring to FIGS. 2 and 10, an etching process is performed on the protective layers 122 in order to prevent the sizes of the air gaps to be formed in the trenches 108 from being decreased by the protective layers 122. The etching process may be a wet-etch process. Additionally, the etching process is performed in order to reduce the thickness of the protective layer 122. The etching process may be performed such that the protective layers 122 remain over the isolation layers 112.

As the thickness of the protective layer 122 becomes thinner due to the etching process, the empty space SP in the trenches 108 becomes larger, allowing the maximum sizes for the air gaps to be formed in the trenches 108.

Referring to FIGS. 2 and 11, a planarization process is performed after the insulating layer 124 is formed over the entire structure of the semiconductor substrate 100

Additionally, in order to form the air gaps AG1 and AG2 between the gate lines WL and DSL and in the trenches 108, the insulating layer 124 may be formed of a material having a poor step coverage (e.g., the PE-USG layer) such that the insulating layer 124 is deposited at the minimum between the gate lines WL and DSL and in the trenches 108 and that the insulating layer 124 remains mainly on the sidewalls of the upper portions of the gate lines WL and DSL.

Consequently, the air gaps AG1 and AG2 extending in the first direction DB in the trenches 108 and in the second direction DW between the gate lines WL and DSL are formed. In detail, the air gaps comprise the first air gaps AG1 and the second air gaps AG2.

The first air gaps AG1 extend in the bit line direction or in the first direction DB in the trenches 108 and are isolated below the select gate lines DSL. The second air gaps AG2 extend in the word line direction or in the second direction DW between the cell gate lines WL and between the cell gate lines WL and the select gate lines DSL. The upper portions of the first air gaps AG1 and the lower portions of the second air gaps AG2 are coupled to each other. Particularly, the upper portions of the first air gaps AG1 are provided between the floating gates 104. Also, since the first air gaps AG1 are formed in the trenches 108 having the upper portions having wider width than the lower portions, the first air gaps AG1 can be formed oval-shaped in the vertical direction with the upper portions having width AW1 wider than the lower portions having width AW2. As the air gaps AG1 and AG2 are formed, the electrical characteristics and reliability of the device are improved as the interference phenomenon is prohibited.

As explained above, after the isolation layers are formed at the isolation regions of the semiconductor substrate and the gate lines are formed over the isolation layers and the active regions of the semiconductor substrate, the damage to the oxide layers from etching can be reduced by etching the isolation layers below the gate lines using the dry-etch process with at least 7:1 etch selectivity with respect to the isolation layers and the gate lines. Such process can be applied not only in flash devices, but also to DRAM, other memory device or to all processes for etching the isolation layers below the gate lines in manufacturing processes of semiconductor devices.

Figure 12:
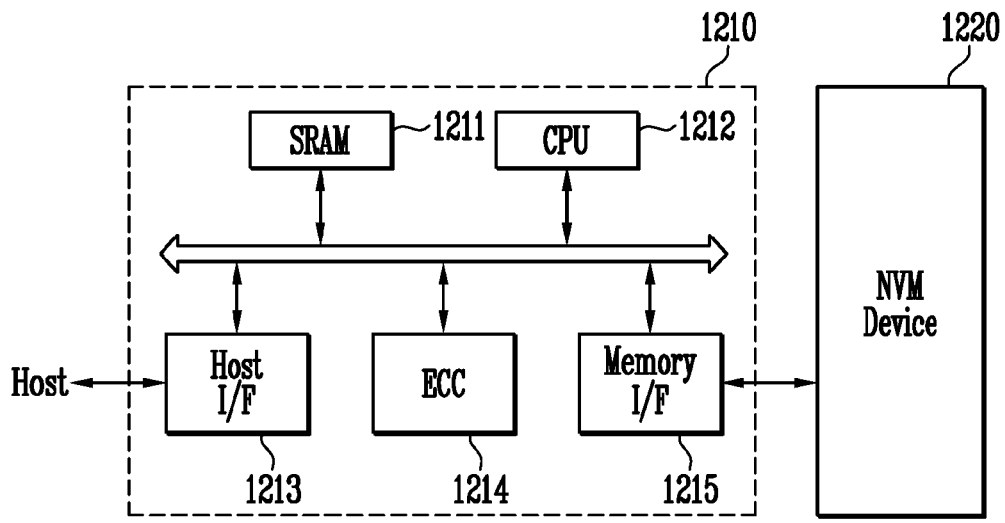
FIG. 12 is a schematic block diagram illustrating a memory system according to an embodiment of the present invention.

FIG. 12 is a schematic block diagram illustrating a memory system according to an embodiment of the present invention.

Referring to FIG. 12, the memory system 1200 according to an embodiment of the present invention comprises a non-volatile memory apparatus 1220 (or non-volatile memory device) and a memory controller 1210.

The non-volatile memory apparatus 1220 comprises a cell region having the structure as described above. The memory controller 1210 is configured to control the non-volatile memory apparatus 1220. It will be provided as a memory card or a solid state disk SSD based on the combination of the non-volatile memory apparatus 1220 and the memory controller 1210. SRAM 1211 is used as an operating memory of a processing unit 1212 (or central processing unit). A host interface 1213 includes a data exchange protocol of the host connecting to the memory system 1200. An error correction block 1214 detects and corrects an error included in data read from the cell region of the non-volatile memory apparatus 1220. A memory interface 1215 may interface with the non-volatile memory apparatus 1220 according to the present invention. The processing unit 1212 may perform all control operations for exchanging data of the memory controller 1210.

Although not shown in the drawings, it will be obvious to a person of ordinary skill in the art that the memory system 1200 according to the present invention may further comprise a ROM (not shown) storing code data for interfacing with the host, etc. The non-volatile memory apparatus 1220 may be provided as a multi-chip package comprising a plurality of flash memory chips. The memory system 1200 according to the present invention may be provided as a highly reliable storage medium having improved operating characteristics. Particularly, the flash memory apparatus according to the present invention may be used in a memory system such as a solid state disk SSD that is actively researched in recent years. In this case, the memory controller 1210 will be configured to communicate with the outside (e.g., host) through one of the various interface protocols such as USB, MMC, PCI-E, SATA, PATA, SCSI, ESDI, IDE, etc.

Figure 13:
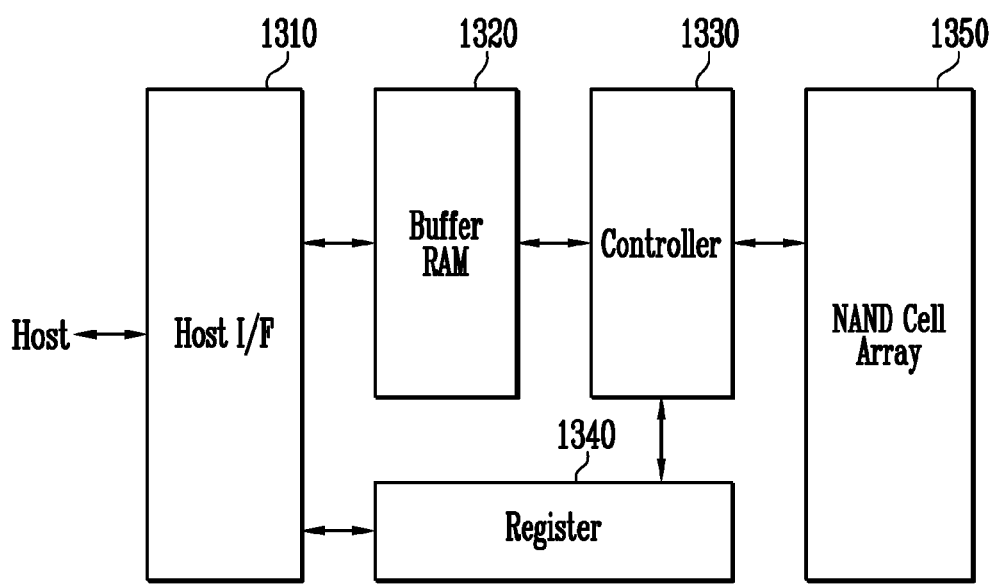
FIG. 13 is a schematic block diagram illustrating a fusion memory apparatus or system performing a program operation.

FIG. 13 is a schematic block diagram illustrating a fusion memory apparatus or system performing a program operation. For example, the technical characteristics according to the present invention may be applied in one NAND flash memory apparatus 1300 as a fusion memory apparatus.

Figure 14:
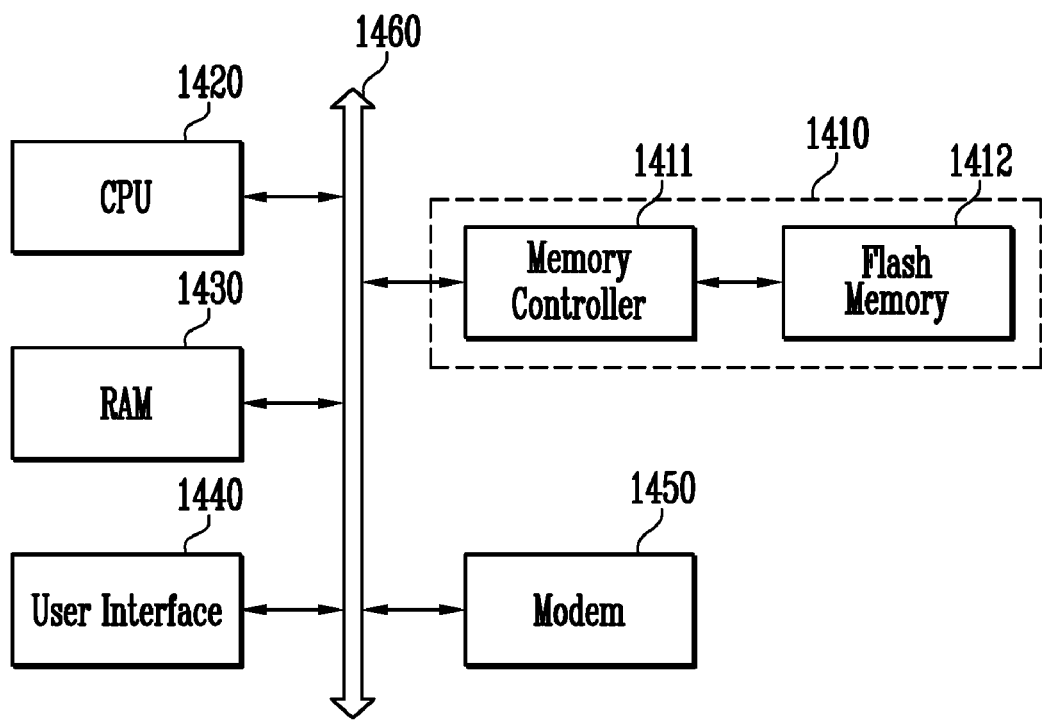
FIG. 14 is a schematic block diagram illustrating a computing system comprising a flash memory apparatus according to an embodiment of the present invention.

The one NAND flash memory apparatus 1300 may comprise: a host interface 1310 for exchanging various information with an apparatus using different protocols; a buffer ram 1320 internally saving code for operating a memory apparatus or temporarily storing data; a controller 1330 reading in response to a control signal and a command provided from the outside and controlling a program and all states; a register 1340 storing data such as a command, an address, a configuration defining the inside system operating environment of the memory apparatus, etc.; and an operating circuit including a nonvolatile memory cell and a page buffer. The one NAND flash memory apparatus programs data according to a general method in response to a write request from the host. The one NAND flash memory apparatus 1300 also comprises a controller operatively coupled with and configured to control a NAND cell array 1350. The NAND cell array 1350 including a cell region having the structure as described above FIG. 14 is a schematic block diagram illustrating a computing system including a flash memory apparatus 1412 according to an embodiment of the present invention.

The computing system 1400 according to the present invention comprises, electrically connected to a system bus 1460, a microprocessor 1420 (or central processing unit), a ram 1430, a user interface 1440, a modem 1450 such as a baseband chipset and a memory system 1410. In the case where the computing system 1400 according to the present invention is a mobile apparatus, a battery (not shown) for supplying an operating voltage of the computing system 1400 may be additionally provided. Although not shown in the drawings, that the computing system 1400 according to the present invention may further comprise an application chipset, a camera image processor CIS, a mobile D-ram, etc. will be obvious to a person of ordinary skill in the art. A memory system 1410 (including a memory controller 1411), for example, may configure a SSD using the non-volatile memory described in FIG. 12 in order to store data. Also, the memory system 1410 may be provided as a fusion flash memory (e.g., one NAND flash memory). Additionally, the system bus 1460 may be electrically connected to input and output devices (not shown) such as, without limitation, a self-contained display in the case of a portable electronic device, a physical keyboard or virtual keyboard, trackball, touchpad, or other cursor control device, etc.

what is claimed is:

1. A method of manufacturing a semiconductor device, the method comprising:
    forming isolation layers in a first direction at trenches at isolation regions defined at a semiconductor substrate and forming gate lines in a second direction crossing the first direction over the isolation layers and active regions defined between the isolation layers;
    performing a dry-etch process to remove the isolation layers; and
    forming an insulating layer over the semiconductor substrate to form a first air gap extending in the first direction in the trenches and a second air gap extending in the second direction between the gate lines, wherein the first air gap and the second air gap are defined simultaneously.

2. The method of claim 1, wherein the isolation layer is formed of polysilazane (PSZ).

3. The method of claim 1, wherein the performing the dry-etch process exposes a bottom surface of a dielectric film included in the gate lines as the isolation layer is removed by the dry-etch process.

4. The method of claim 1, wherein the gate lines comprise select gate lines and cell gate lines between the select gate lines, the cell gate lines having a narrower width than the select gate lines.

5. The method of claim 4, wherein the performing the dry-etch process removes the isolation layer in contact with a bottom surface of the cell gate line and partially removing the isolation layer in contact with a bottom surface of the select gate line.

6. The method of claim 4, wherein the first air gap in the trench is coupled below the cell gate lines and isolated below the select gate lines.

7. The method of claim 1, wherein the dry-etch process uses a fluorine-containing etchant and a hydrogen-containing etchant.

8. The method of claim 7, wherein during the dry-etch process, $NF_3$ or HF using plasma is used as the fluorine-containing etchant and $H_2O$ is used as the hydrogen-containing etchant.

9. The method of claim 7, wherein during the dry-etch process, $HF_2-$ is produced in a reaction between the fluorine-containing etchant and the hydrogen-containing etchant and the $HF_2-$ etches the isolation layer.

10. The method of claim 1, wherein a liner oxide layer is formed on an inner wall of the trench before the isolation layer is formed.

11. A method of manufacturing a semiconductor device, comprising:
    forming an isolation layer at an isolation region of a semiconductor substrate;
    forming a gate line over the isolation layer and the active region of the semiconductor substrate; and
    etching the isolation layer below the gate line using a dry-etch process having at least 7:1 etch selectivity with respect to the isolation layer and an oxide layer exposed at a bottom surface of the gate line.

12. The method of claim 11, wherein during the dry-etch process, $NF_3$ and $H_2O$ are used and the isolation layer is etched isotropically.

13. The method of claim 11, wherein the isolation layer is formed of polysilazane (PSZ).

14. The method of claim 1, wherein the dry-etch process is performed to remove the isolation layers after forming a stacked structure including a tunnel insulating layer, a floating gate, a dielectric layer and a control gate, wherein the stacked structure is formed in each of the gate lines.

15. The method of claim 1, wherein the dry-etch process has at least 7:1 etch selectivity with respect to the isolation layers and an oxide layer exposed at a bottom surface of the gate line.

* * * * *